US009326414B2

(12) United States Patent
Eberle, Jr. et al.

(10) Patent No.: US 9,326,414 B2
(45) Date of Patent: Apr. 26, 2016

(54) METHOD AND APPARATUS FOR MOUNTING RACK COMPONENTS ON RACKS

(75) Inventors: James Joseph Eberle, Jr., Hummelstown, PA (US); Michael Jon Kepko, Etters, PA (US); Jeffrey Dean Shipe, Camp Hill, PA (US); Sean Patrick Kelly, York, PA (US); Bruce Eltringham Barry, Middletown, PA (US); Kenneth C. Hall, Lafayett Hill, PA (US)

(73) Assignee: COMMSCOPE TECHNOLOGIES LLC NC (US)

( * ) Notice: Subject to any disclaimer, the term of this patent is extended or adjusted under 35 U.S.C. 154(b) by 259 days.

(21) Appl. No.: 13/305,872

(22) Filed: Nov. 29, 2011

(65) Prior Publication Data

US 2012/0145874 A1    Jun. 14, 2012

Related U.S. Application Data

(60) Provisional application No. 61/421,740, filed on Dec. 10, 2010.

(51) Int. Cl.
  *A47B 88/00*  (2006.01)
  *H05K 7/14*  (2006.01)

(52) U.S. Cl.
  CPC ......... *H05K 7/1489* (2013.01); *Y10T 29/49826* (2015.01); *Y10T 29/49947* (2015.01)

(58) Field of Classification Search
  USPC ............ 248/220.21, 220.22, 224.7, 235, 241, 248/250, 220.31, 221.11, 222.51, 225.21; 312/334.1, 334.5, 334.22, 334.7, 312/334.8, 223.1, 223.2; 211/26

See application file for complete search history.

(56) References Cited

U.S. PATENT DOCUMENTS

| | | | |
|---|---|---|---|
| 5,571,256 A | 11/1996 | Good et al. | |
| 5,626,406 A | 5/1997 | Schmid | |
| 6,123,303 A * | 9/2000 | Huang | 248/241 |
| 7,014,051 B2 | 3/2006 | Rumney | |
| 7,086,546 B2 * | 8/2006 | Meier | 211/183 |
| 7,703,734 B2 * | 4/2010 | Chen et al. | 248/298.1 |
| 7,937,914 B2 * | 5/2011 | Savicki et al. | 53/510 |
| 8,292,382 B2 * | 10/2012 | Cheng | 312/334.4 |
| 8,348,210 B1 * | 1/2013 | Lee | 248/235 |
| 8,408,506 B2 * | 4/2013 | Yu et al. | 248/219.1 |
| 8,596,471 B2 * | 12/2013 | Chen et al. | 211/26 |
| 2001/0037985 A1 | 11/2001 | Varghese et al. | |
| 2001/0040203 A1 | 11/2001 | Brock et al. | |
| 2002/0043508 A1 | 4/2002 | Lewis | |
| 2004/0120106 A1 | 6/2004 | Searby et al. | |
| 2004/0120123 A1 | 6/2004 | Mayer | |

(Continued)

*Primary Examiner* — Steven Marsh
(74) *Attorney, Agent, or Firm* — Merchant & Gould P.C.

(57) ABSTRACT

The invention pertains to a system for mounting components to a rack comprising brackets that can be mounted to the rear of the rack through the opening in the front of rack before the component is inserted into the slot, which brackets fit into mating sleeves running along the sides of the components. The brackets include arms that extend forwardly towards the front of the slot. After the brackets are attached, the component can be slid into the slot from the front with the sleeves sliding over and engaging the brackets, thereby providing support for the component along a substantial portion of the depth of the component without the need to fixedly attach the component to the bracket after the component is in the rack. Accordingly, a component can be installed in a rack without the need for any access except from the front of the rack.

14 Claims, 10 Drawing Sheets

(56) References Cited

U.S. PATENT DOCUMENTS

| | | | |
|---|---|---|---|
| 2004/0227441 A1* | 11/2004 | Wang et al. | 312/334.8 |
| 2005/0285492 A1* | 12/2005 | Hu et al. | 312/334.4 |
| 2008/0217271 A1* | 9/2008 | Walter | 211/89.01 |
| 2010/0007255 A1 | 1/2010 | Cheng | |
| 2010/0200523 A1 | 8/2010 | Henderson | |

* cited by examiner

METHOD AND APPARATUS FOR MOUNTING RACK COMPONENTS ON RACKS

CROSS REFERENCE TO RELATED APPLICATIONS

This application claims the benefit of U.S. Provisional Patent Application No. 61/421,740, filed Dec. 10, 2010, the entire disclosure of which is hereby incorporated herein by reference.

FIELD OF THE INVENTION

The invention pertains to electronic equipment racks and cabinets. More particularly, the invention pertains to a method and apparatus for mounting rack components, such as cable trays, routers, switches, etc., in such racks and cabinets.

BACKGROUND OF THE INVENTION

The use of an electronic component rack or cabinet for holding a plurality of electronic components, usually in a vertical stack, is well known. Such racks are used in many environments, such as network server farms, telephone switching stations, electronic equipment closets of office buildings containing large amounts of networked electronic equipment, or in countless other environments in which electrical or optical signals need to be switched between numerous electronic components. In such environments, it is not uncommon for a plurality of racks to be tightly packed side by side in a room, with each rack containing a number of vertically stacked electronic components, such as routers, cable trays, data processing equipment, switching equipment, etc. Furthermore, the number of wires and cables that enter and exit the components in the racks can be voluminous, leading to an environment in which it is very difficult to mount and dismount components to and from the racks.

These electronic component racks often comprise little more than a base, four vertical posts and a few horizontal rails running between the posts to hold the structure together. The posts and/or rails may include holes for mating with holes on the components so that bolts can be placed through the mating holes to attach the components to the racks.

Typically, a rack component is installed on a rack by sliding it in a component slot of the rack from the front and then installing bolts through mating holes on the front panel of the component (or on flanges extending laterally from the front panel of the component) and on the front posts of the rack. More specifically, a component can be slid into a slot in the rack until the front panel (or front flanges) butt up against the front posts of the rack. The holes on the panel or flanges align with corresponding holes on the racks and the panels or flanges are bolted to the rack through the mating holes, thereby affixing the component to the rack. In some cases, the components are installed essentially similarly, but are slid in from the rear of the rack toward the front, rather than from the front toward the rear.

However, the components that are mounted in these racks often are sufficiently heavy that they require support toward the rear of the rack as well as the front of the rack. Hence, the components must be bolted (or otherwise attached) to the rack both at their front and at their rear (or at least somewhere else along their lateral sides). Frequently, however, the racks are arranged in such a manner that it is difficult, if not impossible, to gain access to both the front and the rear of the rack and/or sides of the rack. For instance, it is not uncommon for the plurality of racks to be positioned side by side in a long row such that only the front (or only the rear) of the rack is accessible to an installer.

This situation makes it very difficult to access the rear (or front) of the rack in order to bolt a rack component to the rack near the front as well as the rear of the rack.

SUMMARY OF THE INVENTION

The invention pertains to a system for mounting components to a rack comprising brackets that can be mounted to the rear of the rack through the opening in the front of rack before the component is inserted into a slot and mating sleeves running along the sides of the components. The brackets include arms that extend forwardly towards the front of the slot. After the brackets are attached, the component can be slid into the slot from the front with the sleeves sliding over and engaging the brackets. In this manner, the component can be slid into a slot on the rack with the brackets sliding into the sleeves, thereby providing support for the component along a substantial portion of the depth of the component without the need to bolt or otherwise fasten the component to the bracket after the component is in the rack. Accordingly, with the brackets attached, a component can be installed in a rack without the need for any access except from the front of the rack.

DETAILED DESCRIPTION OF THE INVENTION

Figure 1:
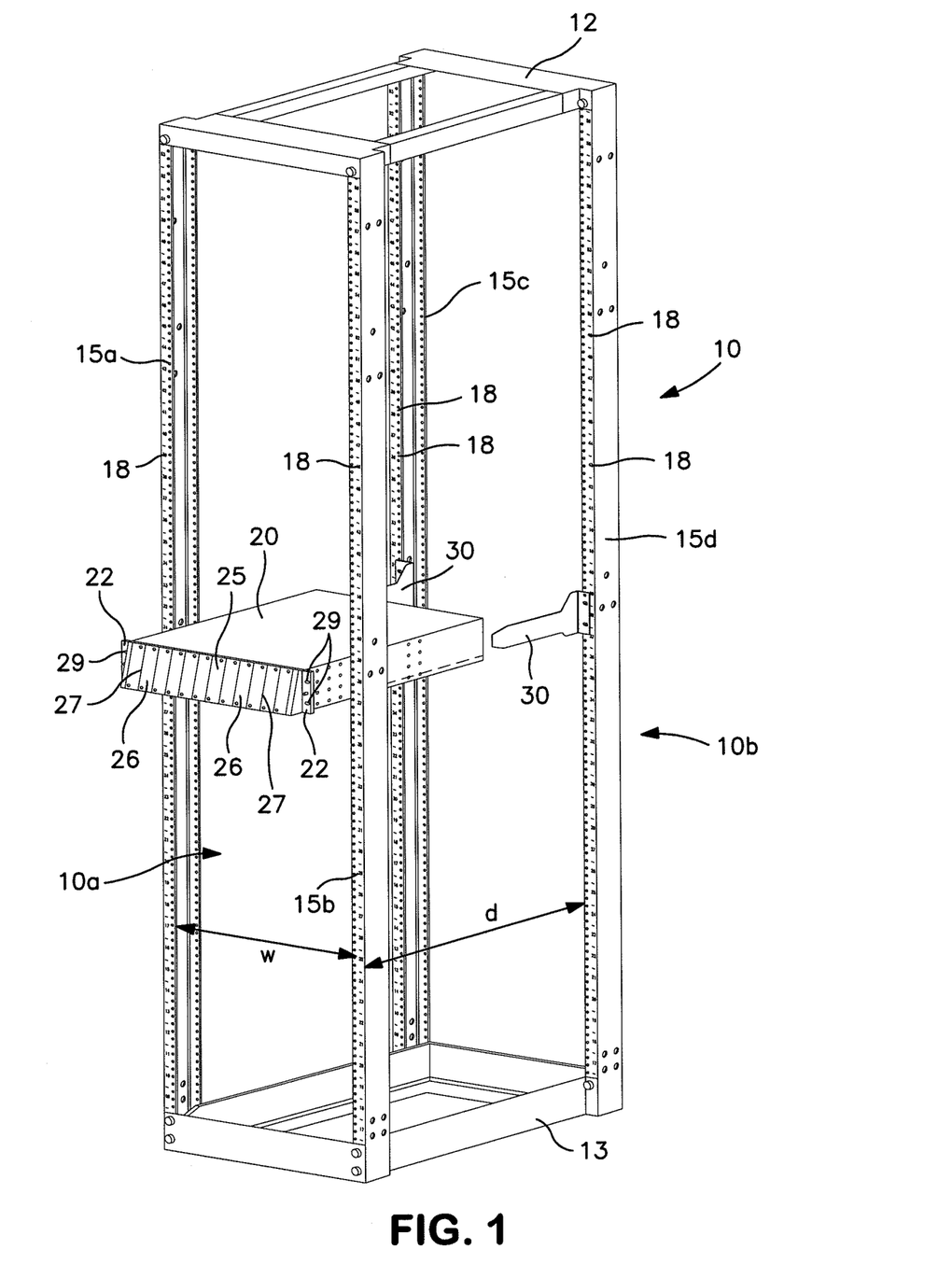
FIG. 1 is a drawing of a four-post electronic equipment rack for accepting a plurality of electronic components in vertically stacked slots with a component partially installed in the rack in accordance with the principles of the present invention.

FIG. 1 is a perspective view of an electronic equipment rack 10 for accepting a plurality of electronic components in vertically stacked slots and showing a rack component 20 in the process of being inserted over two brackets 30 in the rack in accordance with the principles of the present invention. The four post rack 10 of the Figures is exemplary and the invention is not limited to application in such racks. The invention may be applied to other forms of racks as well as cabinets and the like. The exemplary component 20 is a cable tray, comprising a plurality of slots 26 defined by a plurality of separators 27. A cable tray generally does not actually contain any electronic or optical components, but merely assists in the separation and routing of cables (not shown in order not to obscure the invention) through the rack 10. However, the invention is applicable to any form of component that can be mounted in a rack or cabinet.

Typically, such racks comprise a base 13, four posts 15a, 15b, 15c, 15d rising vertically from the base, and a top 12. It may also comprise one or more horizontal rails (not shown) to provide structural support for the rack 10. A plurality of components, such as component 20, may be installed in the rack 10, such as routers, servers, cable trays, switching units, etc. Commonly, the posts 15 and/or the rails include holes 18 for accepting bolts or other fasteners that may be used to affix components to the rack. These holes 18 will align with holes on the housings of the electronic components so that the components may be affixed to the rack by nuts and bolts passing through the mating holes of the rack and the component (or other fasteners). For instance, as seen in FIG. 1, a rack component, such as cable tray 20 typically might have flanges 22 extending laterally from its front face 25, the flanges bearing holes 29 for aligning with the corresponding holes 18 on the rack.

Usually, the components that are installed in racks are of a standardized width, w, corresponding to the width of the rack. However, the depth, d, is not necessarily standardized. That is, components of different depths can be installed in a single rack, with deeper components simply extending further towards the rear of the rack than less deep components.

As previously mentioned, lighter components often only need to be attached to the rack at their front faces. However, heavier components require additional support along the sides or towards the rear of the component.

Hence, many racks contain holes on side or rear rails or on the rear posts 15c, 15d of the rack that are designed to align with corresponding holes on the sides, rear or other flanges on the component 20 so that the component can be fastened to and thereby supported by the rack at locations other than the front of the rack. However, one obviously must be able to access the rear or sides of the rack after the component has been inserted into the slot in order to attach the component to the rack or otherwise support it from the rear or sides of the rack.

Accordingly, in order to solve this problem, the invention provides a bracket and sleeve system for mounting a component 20 to a rack 10 in which the brackets 30 may be mounted to the rack 10 before the component 20 is placed in the rack so that the installer may attach the brackets to the rear 10b of the rack by reaching through the front 10a of the rack 10 (or any other access point) before the component is placed in the rack. For sake of clarity, FIG. 1 (as well as FIG. 4),shows the brackets 30 being mounted flush against the front faces of the rear posts 15c, 15d in order to allow the entirety of the brackets, including the flanges 34, to be seen. However, in many, if not most, situations, it will be preferable for the installer to attach the brackets 30 to the rear posts 15c, 15d with the flange flush against the rear faces of the posts 15c, 15d so that the brackets can be installed without the installer needing to reach around from the rear into the rack with a screw driver to attach the brackets 30 to the posts 15c, 15d.

Figure 2:
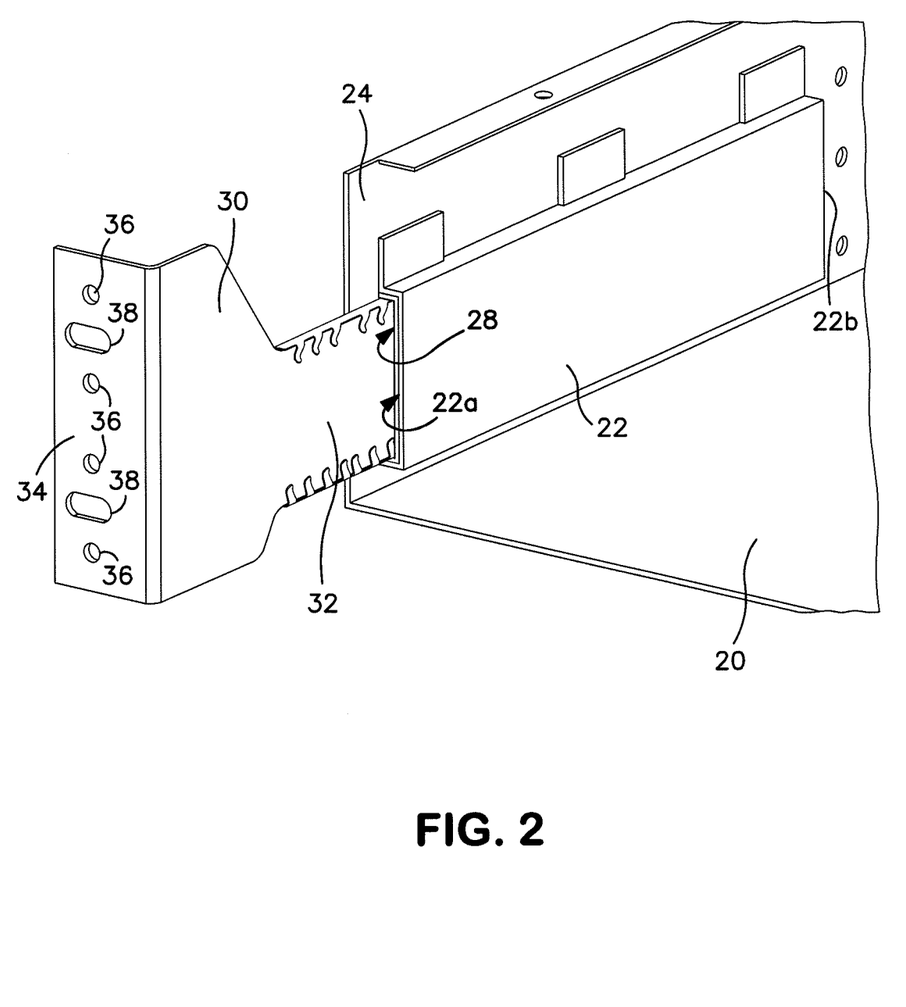
FIG. 2 is a close-up view demonstrating the engagement of the bracket arm with the sleeve of a component in accordance with the principles of the present invention.

With reference to FIG. 2, which is a close up view from the rear of the component 20 showing the component engaged with the bracket 30 (disembodied from the rack for clarity), the component 20 can be slid into the rack 10 from the front of the rack with sleeves 22 (only one of the two sleeves 22 is seen in the close up view of FIG. 2) on the component 20 sliding over and engaging the brackets 30, and with no need to further attach or affix the component 20 to the bracket 30.

Figure 3:
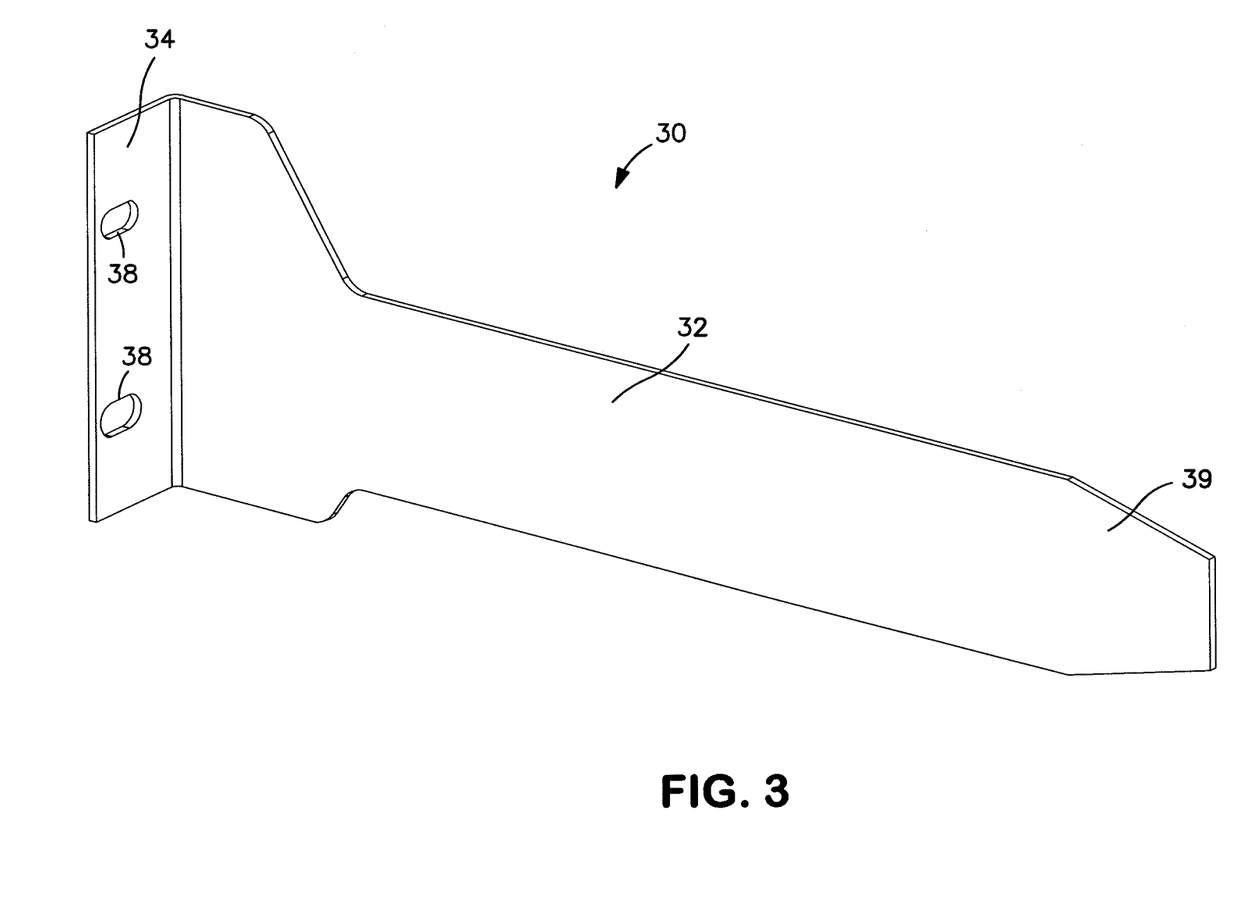
FIG. 3 is a drawing of a bracket in accordance with one embodiment of the invention.

FIG. 3 is a close up view of the exemplary bracket 30 of FIG. 1, except with holes 36 deleted. The bracket 30 comprises an arm 32 that will extend horizontally along the depth, d, of the rack 10 when installed on the rack, as shown in FIG. 1, and a flange 34 bearing holes 36 or slots 38 (or any other reasonable means) for attaching the bracket 30 to the rack 10. The arm 32 is sized and shaped to slide into a sleeve on the housing of a component as will be described in more detail herein.

Referring again to FIG. 2, the component 20 is shown with no cables, separators, or electronics contained therein in order not to obscure the invention. However, it should be understood that, typically, the component 20 will be occupied with electronic circuitry, separators, or other components. Furthermore, the top and rear panels of the component are removed in FIG. 2 also in order not to obscure the invention. In this particular embodiment, the sleeves 22 are located on the internal sides of the opposing lateral side panels 24 of the component (only one side panel 24 and sleeve 22 are visible in the close up view of FIG. 2). Alternately, the sleeves can be positioned on the outer sides of the lateral side panels 24. A cable tray such as illustrated in FIG. 1 normally would not have a rear panel. However, most other types of rack components would have a rear panel. If the sleeves are provided on the internal sides of the lateral side panels, then the rear panel of that component should be designed to provide spaces between its lateral edges and the lateral side walls 24 through which the arms 32 of the brackets 30 can pass in order to slide into the sleeves 22.

The sleeves 22 are sized, shaped, and positioned to slidably receive the arms 32 of the brackets 30 therein through the rear openings 22a of the sleeves. The sleeves may be separate pieces that are attached to the component or may be integrally formed from the panels of the component itself.

Figure 4:
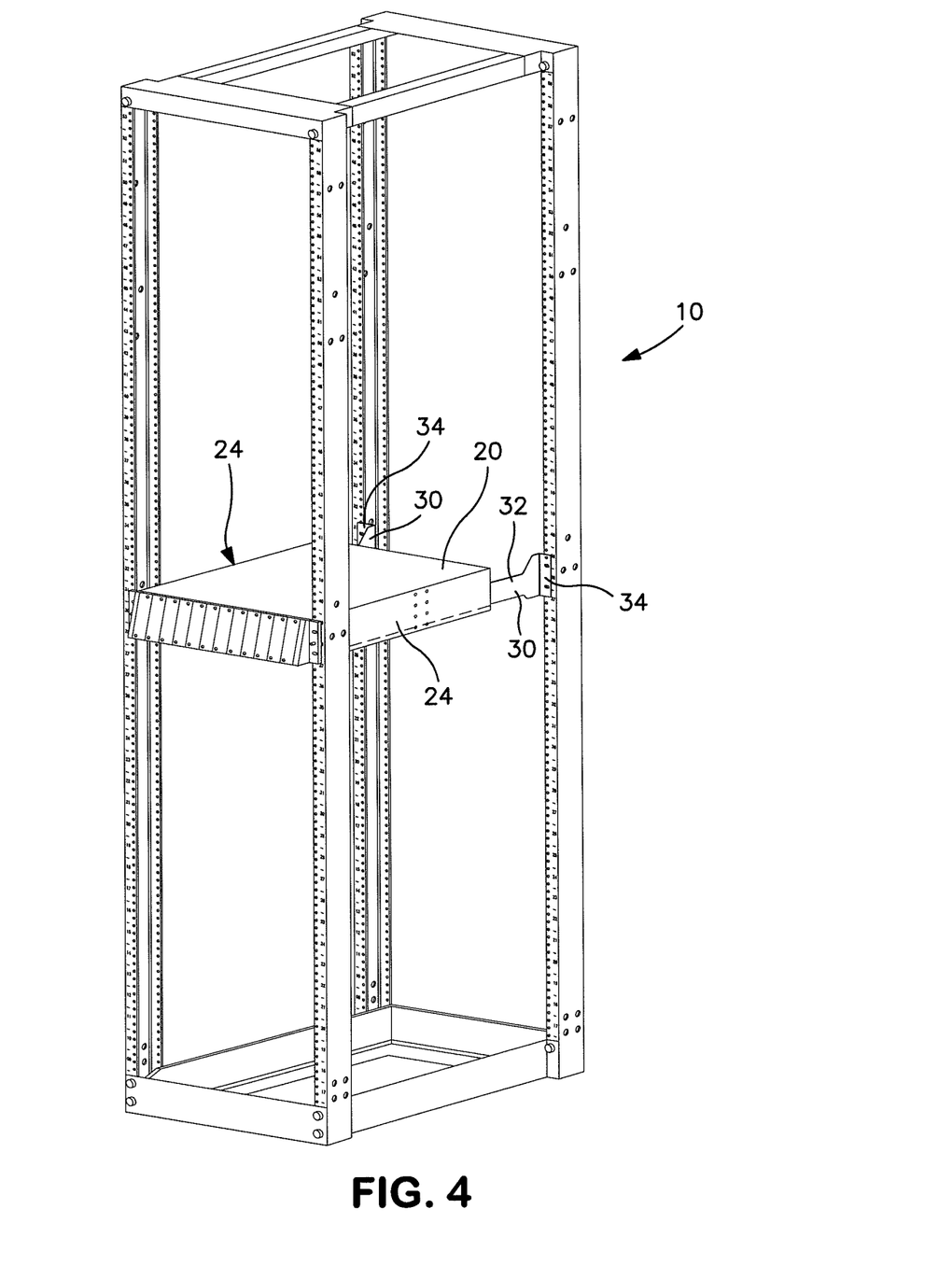
FIG. 4 is a perspective view of a rack with a component fully installed in accordance with the principles of the present invention.

FIG. 4 is a similar view to that of FIG. 1, but showing the component 20 fully inserted into the rack and installed in the brackets 30. The flanges 34 of the brackets 30 should be sized, shaped, and positioned relative to the arms 32 so that their holes 36, slots 38, or other mounting mechanisms can be attached to the rack 10 so that, when mounted, the arms 32 extend horizontally and parallel to each other along the opposing lateral sides of the rack in the depth direction, d, so that a component 20 bearing the sleeves 22 in accordance with the invention can be slid into the front of the rack with the sleeves 22 sliding over and engaging the arms 32 of the brackets 30 as shown in FIG. 4. Thus, the width between the two lateral side panels 24 of the component 20 would need to be selected so that the sleeves 22 are in the proper location to engage the brackets 30 as will be described further below. Thus, for instance, if the sleeves 22 are located on the internal side of the lateral side walls 24 as illustrated in FIG. 2, the lateral side walls should be spaced a little farther apart than if the sleeves were mounted on the external sides of the lateral side walls 24.

In one embodiment, the length of the arm 32 of the bracket is sufficiently long so that it will be guaranteed to engage the sleeve on a component over at least a portion of the arm's length for components of different depths. The sleeves of components of lesser depth would simply engage a shorter portion of the arm 32 than the sleeves of components of greater depth. Thus, components of different depths may be installed within the same front to back rack spacing using identical brackets.

In certain embodiments, the rear end 22a of the sleeve 22 may be flared outwardly in order to facilitate the arm 32 of the bracket entering into the sleeve 22 as the component 20 is being introduced into the rack. Alternately or additionally, the far end 39 of the bracket from the flange may be tapered in one or more axes. The brackets may be sized and shaped so that the installer's appendages and flesh are much less likely to be trapped between the component, bracket, and/or sleeve via guard surfaces. Also, a handle may be attached to or formed into the rear of the component to facilitate sliding it through the rack opening and through the depth of the rack (for rear entry environments). For instance, a small flange could be formed directly from the rear wall of the component that one could grab and pull on to help move the component rearward, avoiding the need to place one's fingers under or beside the component.

Figure 5:
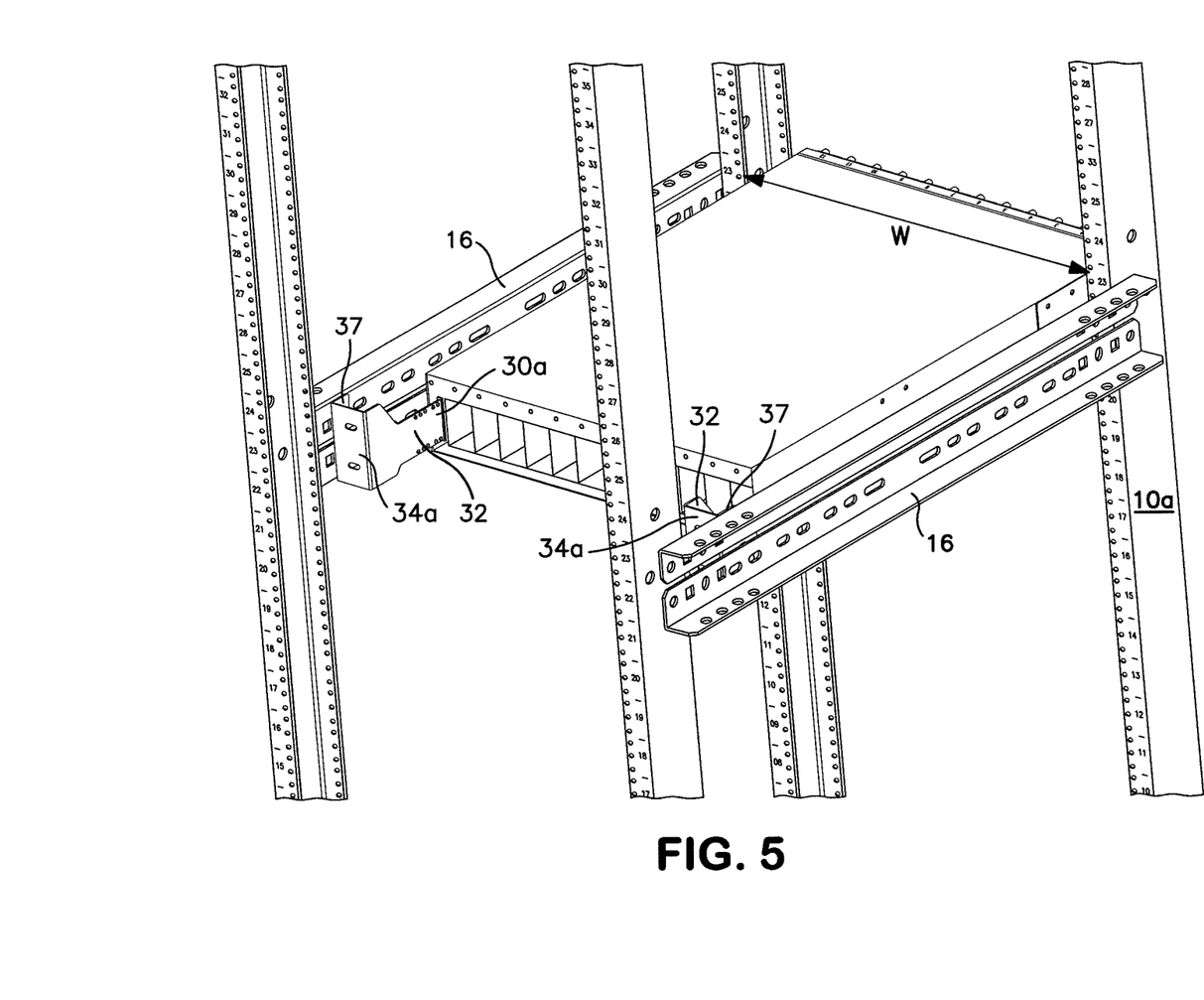
FIG. 5 is a drawing of a rack with an alternate embodiment of a bracket in accordance with the principles of the invention.

The particular embodiment of the bracket shown in FIGS. 2 through 4 is designed to be mounted to a rear post 15c, 15d of a rack. However, the bracket could take many forms depending on the particular design of the rack or cabinet. For instance, FIG. 5 shows an alternate bracket 30a designed to be attached to a rack 10a by bolts extending in the width direction, w, of the rack, rather than the depth direction, d. Specifically, this bracket 30a comprises a first flange 34a, like flange 34 of the first embodiment, extending perpendicularly from the rear end of the arm 32, and a second flange 37 extending perpendicularly from the end of the first flange 34a. This type of design can be used to mount the bracket 30a to a rack 10a or cabinet via either side rails 16 or the rear posts 15c, 15d, with bolts extending laterally rather than in the depth direction.

Other than the sleeve 22 sliding over the bracket 30 or 30a, there is no fixation of the sleeve to the bracket and, therefore, no need to access the bracket after the component is in the rack. Hence, the bracket can be affixed to the rack before the component is installed; when there is access to the rear of the rack through the slot in the rack into which the component will be installed. Thus, an installer can fasten the bracket to the rack by reaching inside of the rack from the front opening into which the component is to be installed without the need for access from the rear or sides of the rack. Then, after the bracket is installed, the component can be slid into the rack through that opening so that the sleeves 22 on the lateral side panels of the component 20 travel over and engage the brackets. The front panel of the component may then be fixed to the rack by bolts and nuts passing through the holes in the front panel (or front flanges) of the component and mating holes on the front posts 15a, 15b of the rack as previously described. The brackets will provide support for the components along the entire portion of the length of the bracket arm that is within the sleeve.

Ball bearings or other bearings may be provided on the bracket arms and/or within the sleeves to facilitate smooth sliding of the bracket arms into the sleeves.

Also, one or more detent features may be provided on the bracket and/or the sleeve to provide one or more tactile stops for the insertion of the component over the brackets.

The engagement of the sleeves with the brackets not only supports the component, but also provides an inherent centering feature for centering the components correctly in the slots of the rack.

The sleeve and/or the bracket also may be coated or entirely formed of a low friction material to ease the sliding of the bracket relative to the sleeve.

In certain embodiments, the arms of the brackets may comprise multiple pieces and may be telescoping, in the nature of a drawer support.

In certain embodiments, an automatic locking mechanism may be provided for locking the brackets to the component. For instance, a lever, cam, wedge, jackscrew, collet, or other mechanism may be included to provide a positive locking mechanism between the bracket and the sleeve (or the component) to enhance the securing of the component to the rack. Such mechanisms may entail a multiple piece mounting bracket with parts that can move relative to each other to effect this locking feature. The movement needed to cause locking may be a vertical movement, such as in conventional dresser drawers, a lateral movement in the width direction of the rack, or a push-pull movement in the depth direction d of the rack. Any reasonable locking mechanism that does not require manual access to the locking mechanism may be employed. For instance, a spring-loaded pawl mechanism or jaw mechanism may be provided inside the sleeve near its proximal end 22b that engages a mating structure at the far end 39 of the arm of the bracket from the flange such that, when the component is slid onto the bracket in the depth direction, the pawl or jaw engages the mating feature of the end of the bracket, causing the pawl or jaw to open against the spring bias in order to pass over the feature on the arm and then close again behind the feature to affect the locking.

Preferably, the locking mechanism also permits the unlocking of the pawl, jaw, or other mechanism from the feature on the bracket without the need to manually access the locking mechanism. For instance, in certain embodiments, the pawls, jaws or other mechanism may be designed to permit disengagement by pulling the component out in the depth direction with sufficient force to overcome the spring bias. In other embodiments, the mechanism may be disengaged by insertion of a tool through a slot in the front face of the component that can engage the locking mechanism and be operated to cause it to unlock from the bracket. In yet other embodiments, a button or lever may be provided on or extending from the front face of the component that can be pressed or otherwise operated to manipulate the pawls, jaws or other mechanisms to cause them to release their engagement with the mating features on the brackets.

In yet other embodiments, the locking mechanism may be a detent mechanism. For instance, a bump on the side of the bracket near the far end of the bracket from the flange may engage a divot in a narrowed portion of the sleeve near the proximal end of the sleeve.

In certain embodiments, the locking mechanism within the sleeve and the bracket may both be formed of a conductive material, such as a metal, so that the engagement of the bracket with the locking mechanism inside the sleeve further serves the purpose of providing a tool-less grounding method for electrically communing the component to the rack.

In yet other embodiments, the brackets may be adjustable in multiple degrees of freedom (roll, pitch, yaw, depth, height, and/or width) so that a single bracket can be used with different width, height and/or depth racks and/or components and/or to permit adjustment of the brackets relative to each other for purposes of leveling of a component within in a rack. The bracket may be provided with a leveling feature that allows adjustment of the angle of the component in the rack in one or more degrees of freedom including roll, pitch, and yaw. The bracket and/or the component may be provided with a level indicator, such as silkscreened lines or a spirit bubble to further assist in leveling the component in the rack from front to back as well as side to side.

In yet other embodiments, the bracket and/or the sleeve may be designed to assist with shock and vibration absorption. For instance, the inside of the sleeve may be lined with a resilient material 28 that absorbs shock and vibration between the bracket and the component. Alternately, leaf or coil springs may be provided within the sleeves to provide shock and vibration absorption.

Figure 6A:
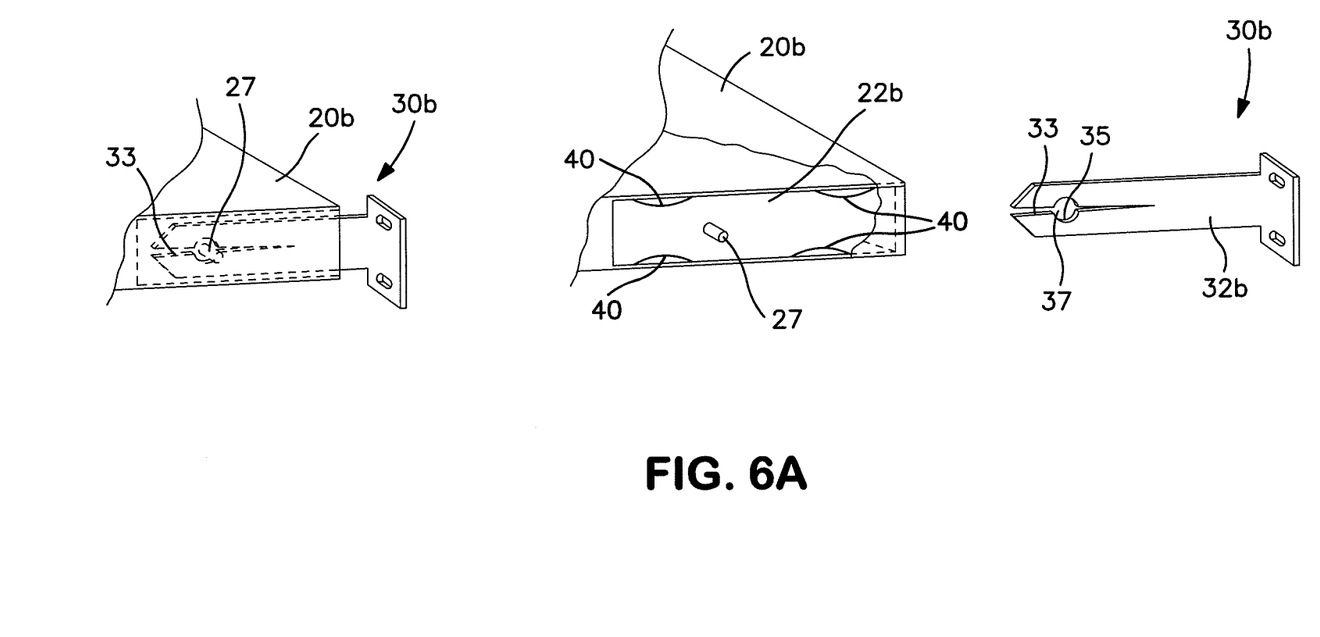
FIGS. 6A through 6E show various embodiments of a locking mechanism between the bracket and the component in accordance with the principles of the present invention.

FIGS. 6A through 6E illustrate four exemplary locking mechanisms for locking the component to the bracket. In FIG. 6A, the bracket 30b has a split arm 32b defining a slit 33 running longitudinally down the center of the arm. The slit includes a carve-out portion 35. The component 20b includes a laterally oriented stud 27 within the sleeve 22b that is wider in diameter than the slit 33 in the arm 32b. When the sleeve and bracket arm are moved into engagement, the stud 27 slides into the slit 33, forcing the slit to open wider to accept the stud therethrough. When the stud reaches the carve-out portion 35, the slit snaps back to a smaller cross section so that the stud 27 is trapped in the carve-out portion 35. The carve-out portion 35 may be shaped with a lead taper 37 so that the component 20b can be removed from the bracket in the same manner by which it was inserted, i.e., by pulling on the component with sufficient force to cause the stud 27 to spread the slit 33 apart wide enough to allow the stud to pass back through it and out of engagement with the arm. FIG. 6A also illustrates leaf springs 40 inside the sleeve 22b such as mentioned in the preceding paragraph for providing shock and vibration absorption.

Figure 6B:
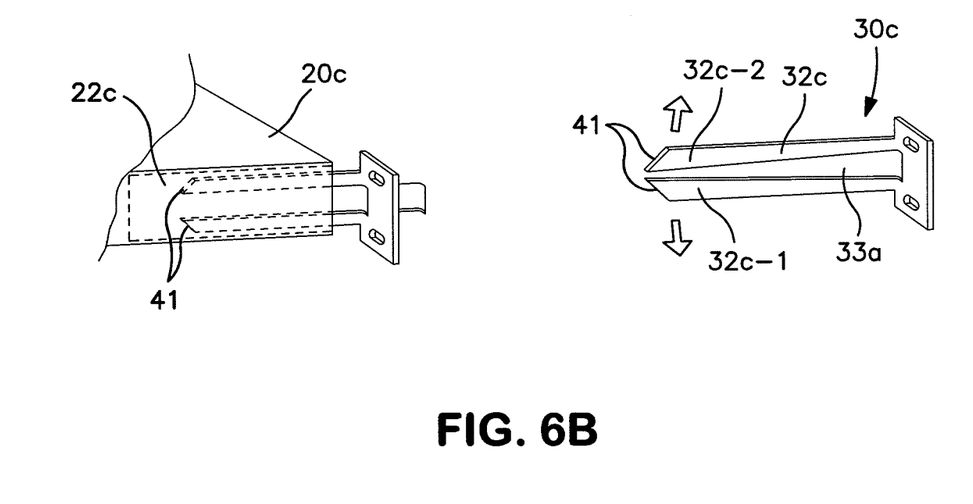

FIG. 6B illustrates another releasable locking mechanism. In this embodiment, the arm 32c of bracket 30c also is split into two halves 32c-1 and 32c-2 by a slit 33a. However, in this embodiment, at least the front end of the arm 32c is slightly wider than the sleeve 22c when the arm is in an unstressed condition. The front ends of the two arm halves may be tapered as shown at 41. When the arm 32c is slid into the sleeve 22c, the tapers 41 meet the edges of the sleeve and force the arm halves to squeeze toward each other, narrowing the slit 33a between them. The slit 33a is wide enough to allow the two arm halves to squeeze together enough to permit the arm 30c to enter the sleeve 22c. However, the friction between the arm and the sleeve will serve to lock the arm within the sleeve and allow the arm to be pulled out of the sleeve (or vice versa) only upon application of a sufficient force. The required force to insert and remove the arm from the sleeve should be set by proper selection of materials and slit design to be large enough that the component cannot fall out accidentally, but small enough so that it can be inserted and removed without the need for force greater than can be applied reasonably by a single person.

Figure 6C:
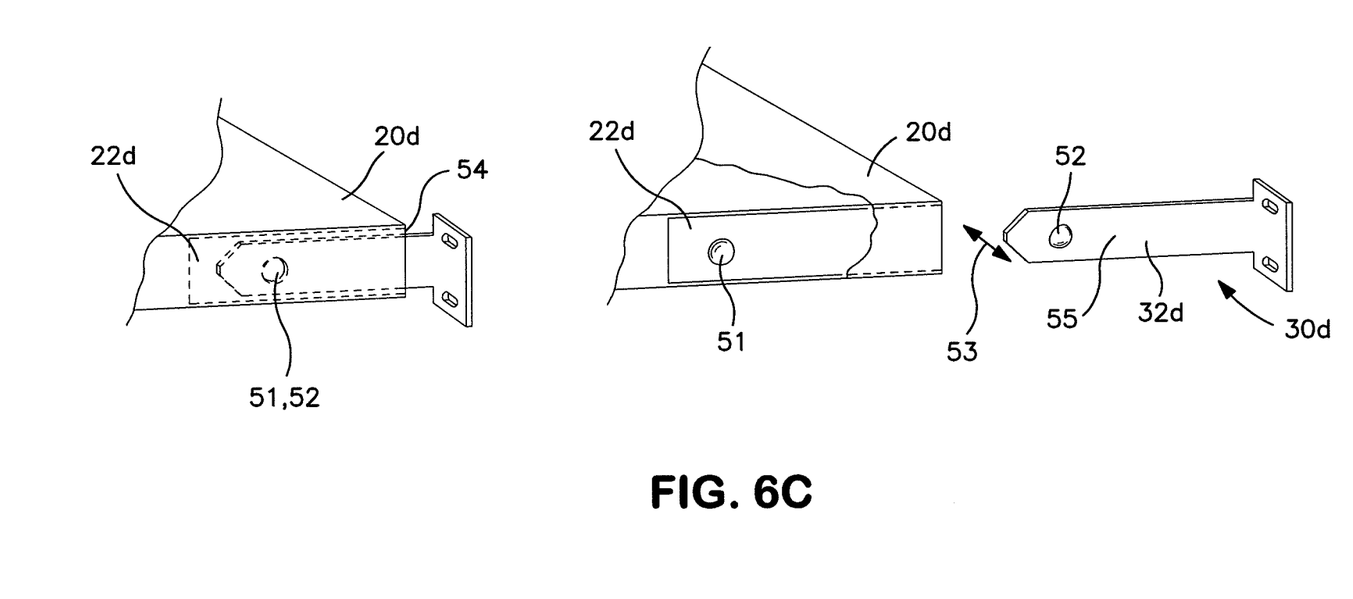

FIG. 6C illustrates yet another embodiment in which the sleeve 22d of component 20d includes an embossed bump 51 and the bracket 30d includes an embossed divot 52. The bracket is positioned relative to the sleeve so that the bracket arm 32d must bend to enter the sleeve 22d. The end of the bracket arm may be curved so as to assure that the arm will initially enter the sleeve without being blocked by the rear edge 54 of the sleeve. The bracket 30d is resilient in the lateral direction as illustrated by arrows 53 so that the bracket will flex to enter the sleeve with the face 55 of the bracket rubbing against the inner face of the sleeve 22d. Thus, when the divot 52 meets up with the bump 51, the arm 32d will snap back slightly, thereby providing a detent-type locking of the bump 51 within the divot 52. The bracket 32d may be withdrawn in the same manner, i.e., by pulling on the component 20d with enough force to overcome the frictional engagement of the bump 51 in the divot 52.

Figure 6D:
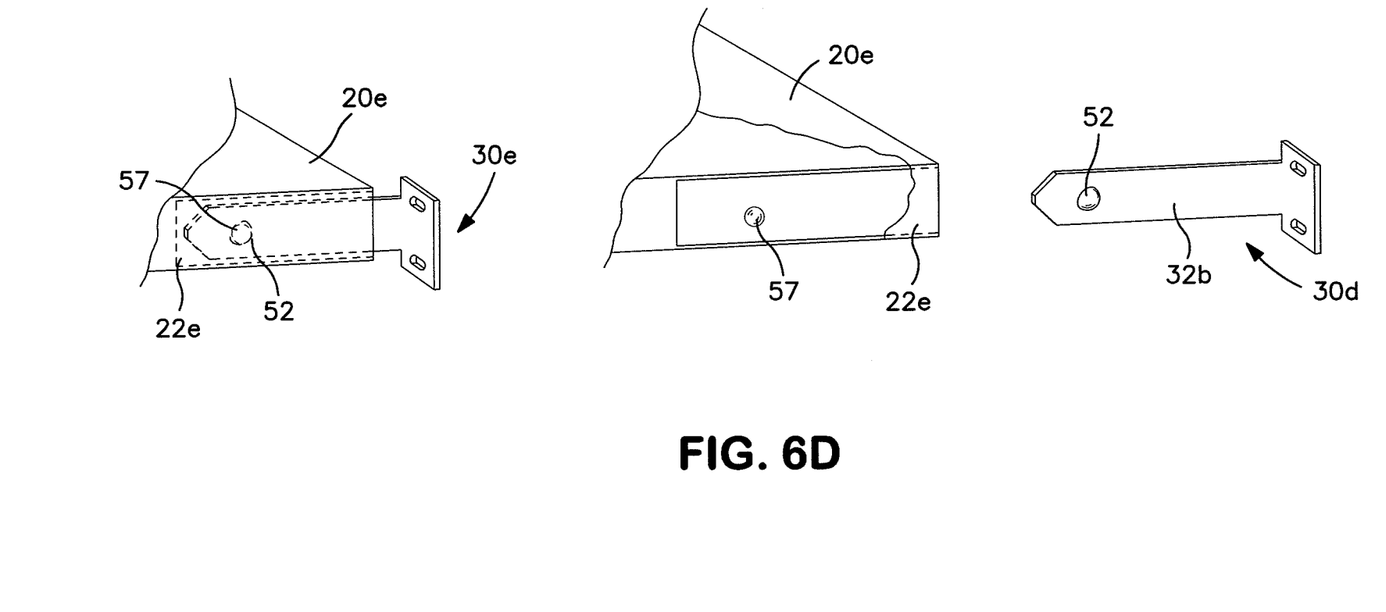

FIG. 6D illustrates yet another embodiment quite similar to the embodiment of FIG. 6C except that, instead of an embossed bump, a spring loaded ball 57 is provided in the sleeve 22e of component 20e to mate with the divot 52 on the arm 32d of the bracket 32d.

Figure 6E:
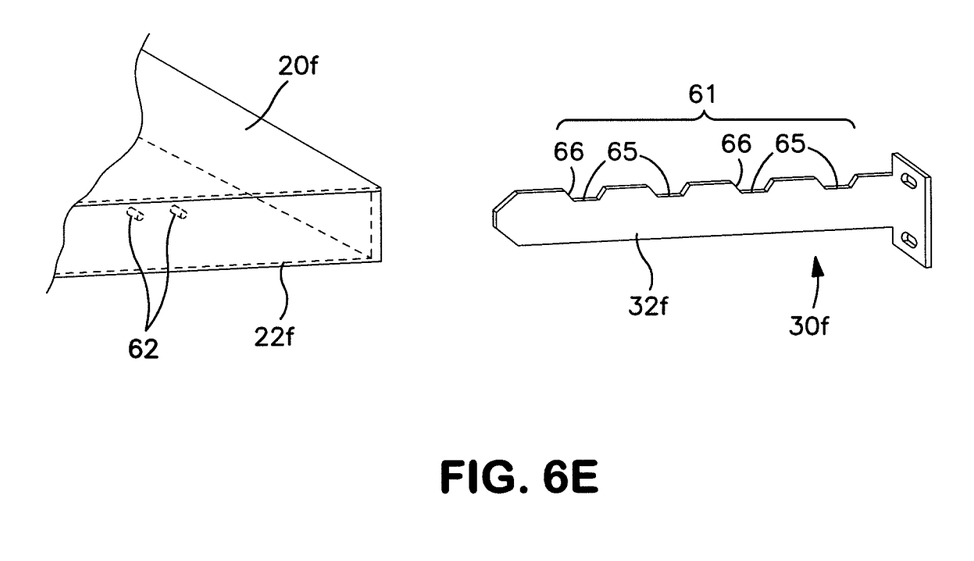

FIG. 6E shows another embodiment in which the arm 32f of the bracket 30f includes a sawtooth pattern 61 on its top edge and one or more pins 62 are disposed within the sleeve 22f of component 20f. The sleeve is inserted over the bracket until the pin(s) drop into the valley(s) 65 of the sawtooth pattern 61, thereby providing another form of detent engagement of the bracket 30f to the component 20f. The component may be disengaged from the detents either by pulling on it with sufficient force to cause the pin(s) 62 to ride up the sloped sides 66 of the valleys 65 or by lifting the component 20f slightly so that the pins 62 rise out of the valleys 65, and then pulling the component 20f out.

While the invention has been described in connection with an exemplary rack system in which access to the rack is afforded from the front of the rack, it should be understood that this scenario is merely exemplary and that the principles described herein can also be applied in situations where the rack is accessed from the rear and the component is slid into the rack from the rear. In such cases, the bracket may be attached to the front of the rack through a slot opening in the rear of the rack with the arm extending from the front of the rack toward the rear of the rack, and the component is slid onto the bracket from the rear of the rack. The rack is accessed from the rear and the component is slid into the rack from the rear. Likewise, the principles described herein can also be applied in situations where the rack is accessed from a side of the rack and the component is slid into the rack sideways. In such cases, the bracket may be attached to the far side of the rack through a slot opening in the near side of the rack with the arm extending laterally from the far side of the rack toward the near side of the rack, and the component is slid onto the bracket sideways from the near side of the rack to the far side of the rack.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

The invention claimed is:

1. A system for mounting a rack component to a rack comprising:

a rack component including a chassis defining an interior, the rack component including opposite flanges extending laterally from the rack component for mounting the rack component to the rack;

first and second brackets each comprising a mounting flange bearing a mounting feature for mounting the first and second brackets to the rack and an arm extending from the mounting flange, the arm having a proximal end adjacent the mounting flange and a distal end, wherein the distal end of the arm is tapered; and first and second sleeves each positioned on the rack component sized and shaped to slidingly receive therein the arm of the mounting bracket, the first and second sleeves being positioned parallel to each other along first and second opposing lateral side panels of the rack component;

wherein the first and second sleeves are located on internal sides of the first and second opposing lateral side panels of the rack component;

wherein the first and second sleeves extend longitudinally in a direction of depth of the rack component and wherein the first and second brackets are adapted so that when the mounting flanges of the first and second brackets are mounted to the rack via the mounting flanges, the arm of each of the first and second brackets extends in a direction of depth of the rack; and wherein the first and second sleeves do not project beyond a rear most surface of the rack component.

2. The system of claim 1, wherein the mounting feature of the flange of each of the first and second brackets comprises at least one hole for receiving a fastener therethrough for fastening the first and second brackets to the rack.

3. The system of claim 1, further comprising a vibration absorbing material interposed between each the arm of the first and second brackets and the first and second sleeves when the arm of the first bracket is received within the first sleeve and when the arm of the second bracket is received within the second sleeve.

4. The system of claim 3, wherein the vibration absorbing material comprises a resilient material lining at least a portion of the inside of the first and second sleeves.

5. The system of claim 3 wherein the vibration absorbing material comprises a spring.

6. The system of claim 1, wherein one end of each of the first and second sleeves is flared.

7. The system of claim 1 wherein the arm is telescopically extendable.

8. The system of claim 1 wherein the arm is adjustable relative to the mounting flange in multiple degrees of freedom.

9. The system of claim 1, further comprising a locking mechanism for locking the arm within each of the first and second sleeves.

10. The system of claim 9, wherein the locking mechanism comprises:
 a split in a far end of the arm of each of the first and second brackets from the flange, the split defining a slit with an enlarged carve-out portion in the slit intermediate the far end of the arm and the flange, and the slit having a minimum width distal of the carve out portion;
 a stud extending from the first and second sleeves having a cross section larger than the minimum width of the slit in each of the first and second sleeves and smaller than a cross section of the carve out portion, the stud positioned so that the stud must slide through the portion of the slit having the minimum width, thereby spreading the slit apart, and into the carve out portion when both the first sleeve is slid over the first bracket and the second sleeve is slid over the second bracket into a fully inserted position within the rack.

11. A method of mounting a rack component in a slot of a rack comprising:
 attaching a first bracket and a second bracket to the rack on opposing lateral sides of the rack and at the rear of the rack, the first and second brackets each including an arm that extends horizontally in a direction between a front and a back of the rack, each arm extending toward the front of the rack parallel to each other, and each arm having a proximal end adjacent the back of the rack and a distal end, wherein the distal end of the arm is tapered;
 providing a rack component including a chassis defining an interior, the rack component including opposite flanges extending laterally from the rack component for mounting the rack component to the rack, the rack component having first and second sleeves disposed within the interior of the rack component, the first and second sleeves being sized and shaped to slidingly receive therein a respective arm of the first and second brackets, wherein the first and second sleeves are disposed on an inner side of a lateral side wall of the rack component and do not project beyond a rear most surface of the rack component; and
 sliding the rack component into a slot in the rack with the first and second sleeves slidingly receiving a respective one of the first and second brackets therein.

12. The method of claim 11, wherein the component comprises a front panel, the method further comprising:
 affixing the front panel of the component to the rack after the first and second sleeves are engaged with the first and second brackets.

13. The method of claim 11, wherein the attaching comprises fastening the brackets to the rack using bolts and nuts.

14. A system for mounting a rack component to a rack comprising:
 a rack component including a chassis defining an interior, the rack component including opposite flanges extending laterally from the rack component for mounting the rack component to the rack;
 first and second brackets each comprising a mounting flange bearing a mounting feature for mounting the first and second brackets to the rack and an arm extending from the mounting flange, the arm having a proximal end adjacent the mounting flange and a distal end, wherein the distal end of the arm is tapered; and
 first and second sleeves each positioned on the rack component sized and shaped to slidingly receive therein the arm of the mounting bracket, wherein the first and second sleeves are disposed within the interior of the rack component and does not project beyond a rear most surface of the rack component;
 wherein the distal end of the arm is disposed within the sleeve; and
 wherein the first and second sleeves are disposed on inner sides of first and second opposing lateral side panels of the rack component.

* * * * *